United States Patent
Galipeau et al.

(10) Patent No.: US 10,931,263 B2
(45) Date of Patent: Feb. 23, 2021

(54) FILTER CIRCUITS HAVING A RESONATOR-BASED FILTER AND A MAGNETICALLY-COUPLED FILTER

(71) Applicant: Qorvo US, Inc., Greensboro, NC (US)

(72) Inventors: Jeffrey D. Galipeau, Apopka, FL (US); Lawrence A. Carastro, Windermere, FL (US); Jeff Dekosky, Winter Garden, FL (US)

(73) Assignee: Qorvo US, Inc., Greensboro, NC (US)

( * ) Notice: Subject to any disclaimer, the term of this patent is extended or adjusted under 35 U.S.C. 154(b) by 92 days.

(21) Appl. No.: 16/054,363

(22) Filed: Aug. 3, 2018

(65) Prior Publication Data

US 2019/0044207 A1    Feb. 7, 2019

Related U.S. Application Data

(60) Provisional application No. 62/540,756, filed on Aug. 3, 2017.

(51) Int. Cl.
*H03H 9/64*      (2006.01)
*H01P 1/20*      (2006.01)
(Continued)

(52) U.S. Cl.
CPC ............ *H03H 9/6483* (2013.01); *H01P 1/20* (2013.01); *H01P 1/20345* (2013.01); *H01P 7/10* (2013.01); *H03H 7/0115* (2013.01); *H03H 7/0161* (2013.01); *H03H 7/09* (2013.01); *H03H 7/1708* (2013.01); *H03H 7/1775* (2013.01); *H03H 9/0095* (2013.01); *H03H 9/542* (2013.01); *H03H 9/605* (2013.01); *H03H 2001/0021* (2013.01); *H03H 2001/0085* (2013.01)

(58) Field of Classification Search
CPC ........ H03H 9/00; H03H 9/0095; H03H 9/542; H03H 9/605; H03H 9/6406; H03H 9/6423; H03H 9/6483; H03H 9/6493; H03H 7/01; H03H 7/0115; H03H 7/0161; H03H 7/09; H03H 7/1708; H03H 7/1775; H03H 2001/0021; H03H 2001/0085; H01P 1/20; H01P 1/20345; H01P 7/10
USPC ....... 333/193, 194, 187, 202, 204, 206, 176, 333/177, 189
See application file for complete search history.

(56) References Cited

U.S. PATENT DOCUMENTS 7,808,935 B2 * 10/2010 Koga .................... H01P 1/213
                                                  333/132
8,988,170 B2 *  3/2015 Yamazaki ........... H03H 9/6483
                                                  333/187

(Continued)

FOREIGN PATENT DOCUMENTS

JP        09-232907 A   *  9/1997

*Primary Examiner* — Barbara Summons
(74) *Attorney, Agent, or Firm* — Withrow & Terranova, P.L.L.C.

(57) ABSTRACT

Filter circuits having a resonator-based filter and a magnetically-coupled filter are disclosed. A filter circuit is deployed with a resonator-based passband filter connected to a magnetically-coupled filter which mitigates or reduces flyback of the resonator-based filter. The magnetically-coupled filter can be a passband filter with a relatively low insertion loss. The magnetically-coupled filter can be designed to mitigate flyback of the resonator-based filter by attenuating frequency response at selected frequency ranges.

18 Claims, 4 Drawing Sheets

(51) Int. Cl.
   *H03H 9/00*    (2006.01)
   *H03H 7/09*    (2006.01)
   *H03H 7/01*    (2006.01)
   *H01P 7/10*    (2006.01)
   *H01P 1/203*   (2006.01)
   *H03H 9/60*    (2006.01)
   *H03H 9/54*    (2006.01)
   *H03H 1/00*    (2006.01)

(56) References Cited

U.S. PATENT DOCUMENTS

| | | | |
|---|---|---|---|
| 9,019,045 B2* | 4/2015 | Maurer | H03H 9/0542 |
| | | | 333/189 |
| 9,742,451 B2* | 8/2017 | Yatsenko | H04B 1/1036 |
| 2015/0094009 A1* | 4/2015 | Yosui | H04B 1/16 |
| | | | 455/307 |
| 2015/0222246 A1* | 8/2015 | Nosaka | H03H 9/6483 |
| | | | 333/187 |
| 2016/0277002 A1* | 9/2016 | Nakahashi | H03H 9/542 |
| 2017/0077896 A1* | 3/2017 | Sugaya | H03H 9/64 |
| 2017/0133997 A1* | 5/2017 | Imamura | H01F 17/0013 |
| 2017/0179927 A1* | 6/2017 | Galipeau | H03H 9/542 |
| 2017/0257078 A1* | 9/2017 | Leipold | H03H 9/605 |
| 2018/0076793 A1* | 3/2018 | Khlat | H03H 9/52 |
| 2019/0081612 A1* | 3/2019 | Tang | H03H 9/542 |

\* cited by examiner

FILTER CIRCUITS HAVING A RESONATOR-BASED FILTER AND A MAGNETICALLY-COUPLED FILTER

RELATED APPLICATIONS

This application claims the benefit of provisional patent application Ser. No. 62/540,756, filed Aug. 3, 2017, the disclosure of which is hereby incorporated herein by reference in its entirety.

FIELD OF THE DISCLOSURE

The present disclosure relates to filter circuits that employ resonators, such as acoustic wave resonators, and in particular to enhancing filter circuit performance through a resonator-based filter and a magnetically-coupled filter.

BACKGROUND

Filter circuits incorporating acoustic resonators (e.g., Surface Acoustic Wave (SAW) resonators and Bulk Acoustic Wave (BAW) resonators) are used in many high-frequency communication applications. SAW- and BAW-based filters have relatively low insertion loss, tend to decrease in size as the frequency of operation increases, and are relatively stable over wide temperature ranges. As such, SAW- and BAW-based filters are the filter of choice for many 3rd Generation (3G) and 4th Generation (4G) wireless communications systems and are likely to dominate filter applications for 5th Generation (5G) wireless communications systems.

These 3G, 4G, and 5G wireless communications systems can support cellular, wireless fidelity (Wi-Fi), Bluetooth, and/or near field communications on the same wireless device and, as such, pose extremely challenging filtering demands. For example, filters need to have flat passbands, have steep filter skirts and squared shoulders at the upper and lower ends of the passband, and provide excellent rejection outside of the passband. While these demands keep raising the complexity of wireless devices, there is a constant need to improve the performance of acoustic resonators and filters that are based thereon.

SUMMARY

Exemplary aspects of the present disclosure relate to filter circuits having a resonator-based filter and a magnetically-coupled filter. Resonator-based passband filters, such as Bulk Acoustic Wave (BAW) filters and Surface Acoustic Wave (SAW) filters, can experience flyback outside a first passband. That is, a frequency response of resonator-based filters can have higher rejection near the first passband, but further outside the first passband the frequency response "flies back" or has lower rejection, leading to excessive out-of-band noise or interference.

In aspects disclosed herein, a filter circuit deploys a resonator-based passband filter connected to a magnetically-coupled filter which mitigates or reduces flyback of the resonator-based filter. The magnetically-coupled filter can be a passband filter with a relatively low insertion loss and a wider, second passband. The frequency response of the magnetically-coupled filter has two or more notches (e.g., zeros) which can controllably attenuate frequencies outside the first passband of the resonator-based filter. In this manner, the magnetically-coupled filter can be designed to mitigate flyback of the resonator-based filter by attenuating frequency response at selected frequency ranges.

In an exemplary aspect, a filter circuit is provided. The filter circuit includes a first circuit port, a second circuit port, and a first filter connected between the first circuit port and the second circuit port. The first filter includes a first shunt inductor magnetically coupled to a second shunt inductor. The filter circuit also includes a second filter connected in series with the first filter between the first circuit port and the second circuit port. The second filter includes a plurality of acoustic wave resonators in a ladder configuration.

In another exemplary aspect, a filter circuit is provided. The filter circuit includes a resonator-based filter comprising a plurality of resonators and configured as a band pass filter for a first frequency range. The filter circuit also includes a magnetically-coupled filter comprising a pair of shunt inductors magnetically coupled together and configured to reduce a flyback response of the resonator-based filter in a second frequency range below the first frequency range and a third frequency range above the first frequency range.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
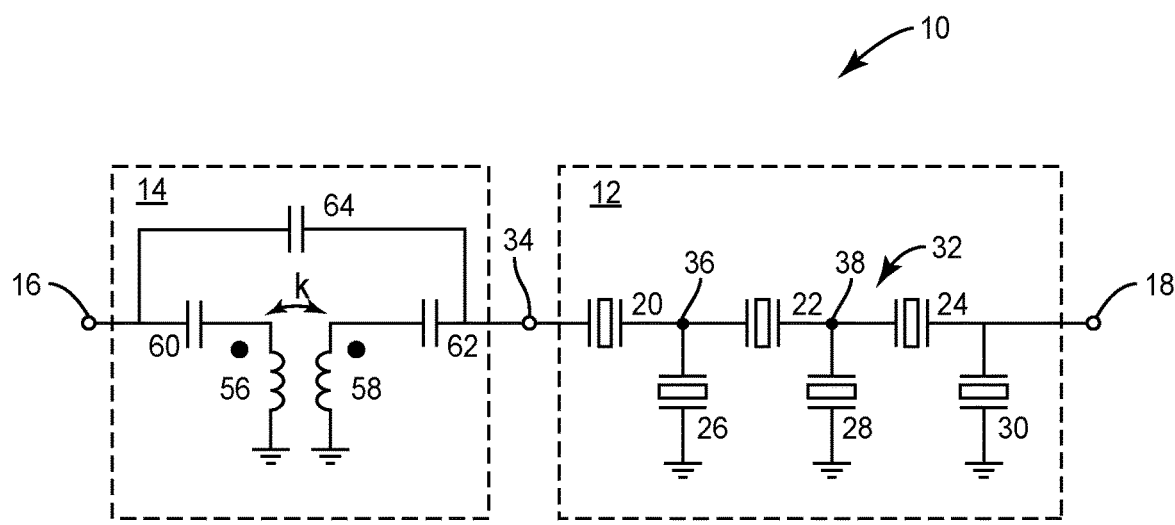
FIG. 1 depicts an exemplary schematic diagram of a filter circuit having a resonator-based filter and a magnetically-coupled filter.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" to another element, it can be directly connected to the other element or intervening elements may be present. In contrast, when an element is referred to as being "directly connected" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Exemplary aspects of the present disclosure relate to filter circuits having a resonator-based filter and a magnetically-coupled filter. Resonator-based passband filters, such as Bulk Acoustic Wave (BAW) filters and Surface Acoustic Wave (SAW) filters, can experience flyback outside a first passband. That is, a frequency response of resonator-based filters can have higher rejection near the first passband, but further outside the first passband the frequency response "flies back" or has lower rejection, leading to excessive out-of-band noise or interference.

In aspects disclosed herein, a filter circuit deploys a resonator-based passband filter connected to a magnetically-coupled filter which mitigates or reduces flyback of the resonator-based filter. The magnetically-coupled filter can be a passband filter with a relatively low insertion loss and a wider, second passband. The frequency response of the magnetically-coupled filter has two or more notches (e.g., zeros) which can controllably attenuate frequencies outside the first passband of the resonator-based filter. In this manner, the magnetically-coupled filter can be designed to mitigate flyback of the resonator-based filter by attenuating frequency response at selected frequency ranges.

FIG. 1 depicts an exemplary schematic diagram of a filter circuit 10 having a resonator-based filter 12 and a magnetically-coupled filter 14. In the filter circuit 10 depicted in FIG. 1, the resonator-based filter (e.g., a first filter) 12 and the magnetically-coupled filter (e.g., a second filter) 14 are connected in series between a first circuit port 16 and a second circuit port 18. The first circuit port 16 and the second circuit port 18 correspond to an input and output port of the filter circuit 12, respectively, or vice versa.

In an exemplary aspect, the resonator-based filter (e.g., the first filter) 12 is configured as a passband filter with an appropriate topology incorporating multiple resonators 20, 22, 24, 26, 28, 30. As depicted, the resonator-based filter 12 deploys the resonators 20, 22, 24, 26, 28, 30 in a ladder topology, which includes a series branch 32 connected between the first circuit port 16 and the second circuit port 18. The series branch 32 can include one or more series resonators 20, 22, 24. In the example depicted, the series branch 32 includes a first series resonator 20 connected between a first node 34 (which can be connected to the magnetically-coupled filter 14) and a second node 36 in the series branch 32, a second series resonator 22 connected between the second node 36 and a third node 38 in the series branch 32, and a third series resonator 24 connected between the third node 38 in the series branch 32 and the second circuit port 18.

The resonator-based filter 12 also includes one or more shunt resonators 26, 28, 30 connected between the series branch 32 and a fixed voltage node (e.g., a circuit ground). In the example depicted, the resonator-based filter 12 includes a first shunt resonator 26 connected between the second node 36 in the series branch 32 and the fixed voltage node, a second shunt resonator 28 connected between the third node 38 in the series branch 32 and the fixed voltage node, and a third shunt resonator 30 connected between the second circuit port 18 and the fixed voltage node. In other examples, the series branch 32 may include more or fewer series resonators 20, 22, 24, and more or fewer shunt resonators 26, 28, 30 may be connected to the series branch 32 according to design considerations for the filter circuit 10.

It should be understood that the ladder topology of the resonator-based filter 12 depicted in FIG. 1 is exemplary, and in other examples the resonator-based filter 12 may be a passband filter deploying other topologies, such as a lattice topology or a transversal topology (e.g., in which each of multiple resonators 20, 22, 24, 26, 28, 30 is arranged transverse to the first circuit port 16 and the second circuit port 18). In addition, in some examples each of the resonators 20, 22, 24, 26, 28, 30 in the resonator-based filter 12 is a BAW resonator, while in other examples SAW resonators, ceramic resonators, and/or Dielectric Resonator Oscillators (DROs) may be deployed in a similar manner.

Figure 2:
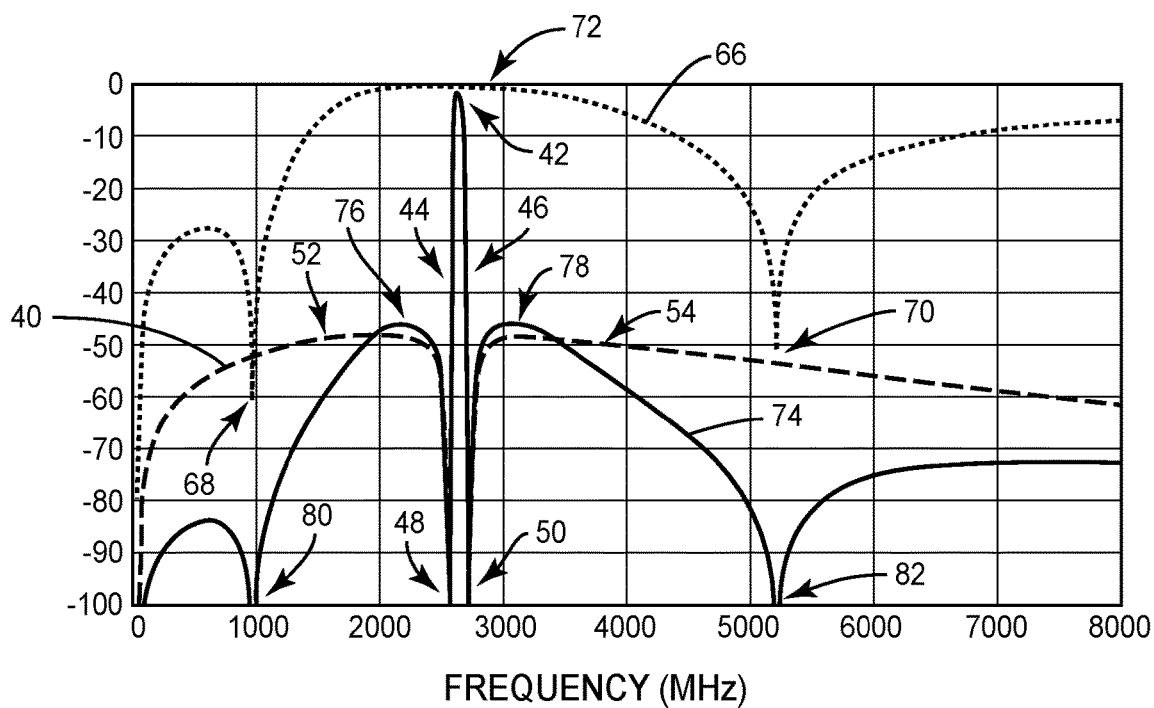
FIG. 2 depicts a graphical representation of an exemplary frequency response of the filter circuit and the component filters depicted in FIG. 1.

FIG. 2 depicts a graphical representation of an exemplary frequency response of the filter circuit 10 and the component filters 12, 14 depicted in FIG. 1. As depicted in FIG. 2, the resonator-based filter 12 depicted in FIG. 1 has a frequency response 40 which can be characterized by a relatively low insertion loss at a passband 42 and high Q transition skirts 44, 46 leading to higher rejection regions 48, 50 above and below the passband 42. The frequency response 40 of the resonator-based filter 12 also has an out-of-band flyback 52, 54 near the passband 42 in which the frequency response 40 "flies back" or has lower rejection. The flyback 52, 54 may allow excessive noise interference, particularly in frequency ranges of other communications signals near target frequencies of the filter circuit 10.

With continued reference to FIGS. 1 and 2, in order to reduce or mitigate the out-of-band flyback 52, 54 of the resonator-based filter 12, the filter circuit 10 incorporates the magnetically-coupled filter 14. The magnetically-coupled filter (e.g., the second filter) 14 is connected in series with the resonator-based filter 12 between the first circuit port 16 and the second circuit port 18. In an exemplary aspect, the magnetically-coupled filter 14 includes a first shunt inductor 56 magnetically coupled to a second shunt inductor 58. In other words, the first shunt inductor 56 can be electrically connected to the first circuit port 16 and the fixed voltage node (e.g., the circuit ground), and the second shunt inductor 58 can be electrically connected to the first node 34 and the fixed voltage node. However, the first shunt inductor 56 and the second shunt inductor 58 are magnetically, but not electrically, coupled together.

In an exemplary aspect, the first shunt inductor 56 and the second shunt inductor 58 can be a magnetically coupled pair of shunt inductors 56, 58, which may be laminated one over the other and coupled to a substrate, such as an Integrated Circuit (IC) substrate, with a dielectric layer disposed between the first shunt inductor 56 and the second shunt inductor 58. As depicted in FIG. 1, the magnetically-coupled filter 14 also includes a first series capacitor 60 connected between the first shunt inductor 56 and the first circuit port 16. A second series capacitor 62 is connected between the second shunt inductor 58 and the resonator-based filter 12 (e.g., the first filter), and may be connected to the first node 34 of the series branch 32. In addition, the magnetically-coupled filter 14 includes a bypass capacitor 64 connected between the first circuit port 16 and the resonator-based filter 12.

As depicted in FIG. 2, the magnetically-coupled filter 14 has a frequency response 66 which contributes a first notch (e.g., zero) 68 and a second notch 70. The magnetically-coupled filter 14 is generally configured to have a wide second passband 72 between the first notch 68 and the second notch 70. The frequency response 66 of the magnetically-coupled filter 14 also has a relatively low insertion loss (e.g., 0.40 dB or less) within the first passband 42 of the resonator-based filter 12.

FIG. 2 further depicts a frequency response 74 of the filter circuit 10 of FIG. 1, which combines effects of the frequency response 40 of the resonator-based filter 12 and the frequency response 66 of the magnetically-coupled filter 14. The frequency response 74 can therefore be characterized by a relatively low insertion loss at the passband 42, which is only slightly attenuated in comparison with the frequency response 40 of the resonator-based filter 12 alone due to the relatively low insertion loss of the magnetically-coupled filter 14. The frequency response 74 of the filter circuit 10 also has high Q transition skirts 44, 46 leading to higher rejection regions 48, 50 above and below the passband 42. The frequency response 74 of the filter circuit 10 has an out-of-band flyback 76, 78 near the passband 42, which is mitigated by the inclusion of a first notch 80 (e.g., due to the contribution of the first notch 68 of the magnetically-coupled filter 14) below the passband 42 and a second notch 82 (e.g., due to the contribution of the second notch 70 of the magnetically-coupled filter 14) above the passband 42.

The first notch 80 of the frequency response 74 of the filter circuit 10 can incorporate higher rejection around a first targeted frequency range below the passband 42 in order to mitigate or reduce interference from signals within the first targeted frequency range. Similarly, the second notch 82 can incorporate higher rejection around a second targeted frequency range above the passband 42 in order to mitigate or reduce interference from signals within the second targeted frequency range. In the example depicted in FIG. 2, the passband 42 can be the 2.6 GHz range of cellular 3G/4G Long Term Evolution (LTE) and/or Wi-Fi frequency bands. In this regard, the frequency response 74 of the filter circuit 10 can have the passband 42 with a center frequency of 2.6 GHz. The first notch 80 can attenuate (e.g., reject) signals near the 2G cellular 800 MHz frequency bands, and the second notch 82 can attenuate signals near the Wi-Fi and/or harmonic frequencies of the 2.6 GHz bands around 5 GHz.

In this manner, the filter circuit 10 of FIG. 1, including the resonator-based filter 12 connected in series with the magnetically-coupled filter 14 between the first circuit port 16 and the second circuit port 18, mitigates or reduces the flyback 52, 54 of the resonator-based filter 12. The magnetically-coupled filter 14 can be designed to mitigate the flyback 52, 54 by attenuating the frequency response 74 of the filter circuit 10 at the selected frequency ranges through the first notch 68 and the second notch 70.

In the exemplary schematic diagram of FIG. 1, the filter circuit 10 is shown with the resonator-based filter 12 connected to the second circuit port 18 and the magnetically-coupled filter 14 coupled to the first circuit port 16. It should be understood that the resonator-based filter 12 and the magnetically-coupled filter 14 can be connected in series with these relative positions reversed. It should further be understood that the first circuit port 16 can serve as an input port and/or an output port, and the second circuit port 18 can serve as an input port and/or an output port. In some examples, harmonic performance and/or power performance may be improved where the magnetically-coupled filter 14 is coupled to the first circuit port 16 and the first circuit port 16 is an output port. In such examples, performance may be further improved by placing the second notch 70 at a harmonic frequency of the resonator-based filter 12.

Figure 3A:
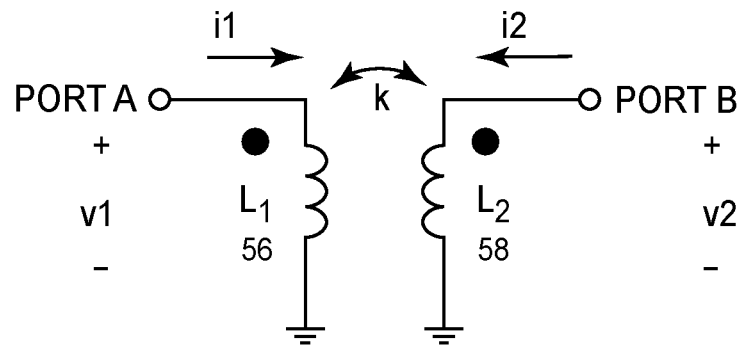
FIG. 3A depicts an exemplary schematic diagram of a pair of shunt inductors magnetically coupled together.

In this regard, FIG. 3A depicts an exemplary schematic diagram of the pair of shunt inductors 56, 58 magnetically coupled together. The first shunt inductor 56 has an inductance value of $L_1$ and is magnetically coupled to the second shunt inductor 58 (having an inductance value of $L_2$) with a coupling coefficient k. The coupling coefficient k is a fractional value representing a flux linkage between the first shunt inductor 56 and the second shunt inductor 58 as a fraction of the total possible flux linkage between the pair of shunt inductors 56, 58. The coupling coefficient k may be determined as a function of frequency from the 2-port S-parameter ($|S_{21}|$) (e.g., the forward voltage gain) of a coupled inductor model defined between PORT A and PORT B of FIG. 3A.

Figure 3B:
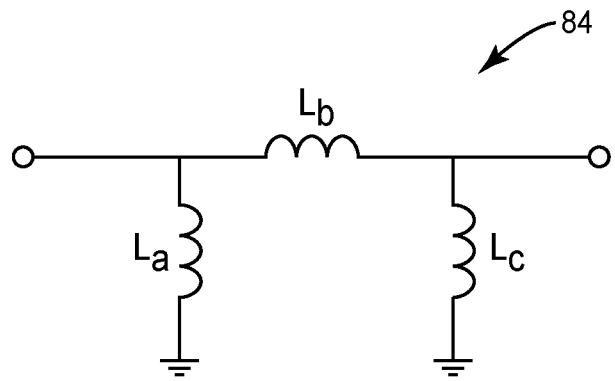
FIG. 3B depicts a schematic diagram of an equivalent circuit for the pair of shunt inductors of FIG. 3A.

FIG. 3B depicts a schematic diagram of an equivalent circuit 84 for the pair of shunt inductors 56, 58 of FIG. 3A. In the equivalent circuit 84, the pair of shunt inductors 56, 58 is modeled as a Pi model having a first shunt inductance $L_a$, a second equivalent shunt inductance $L_c$, and a virtual inductance $L_b$. The inductance values $L_a$, $L_b$, and $L_c$ can be determined by the following formulas:

$$L_a = \frac{L_1 * L_2(1-k^2)}{L_2 - k\sqrt{L_1 * L_2}} \quad \text{Equation 1}$$

$$L_b = \frac{L_1 * L_2(1-k^2)}{L_2 - k\sqrt{L_1 * L_2}} \quad \text{Equation 2}$$

$$L_a = \frac{L_1 * L_2(1-k^2)}{L_2 - k\sqrt{L_1 * L_2}} \quad \text{Equation 3}$$

In accordance with Equations 1-3 above, the equivalent circuit 84 can be modeled as a pair of shunt inductances $L_a$, $L_c$ connected by a larger virtual inductance $L_b$, which may be too large to implement in a practical circuit (e.g., the virtual inductance $L_b$ can be between 4 nH and 20 nH).

Figure 3C:
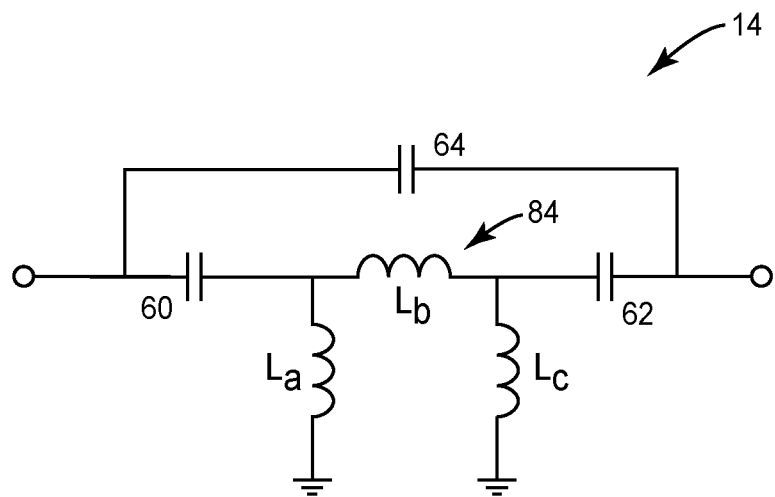
FIG. 3C depicts an exemplary schematic diagram of the magnetically-coupled filter of FIG. 1, illustrating an equivalent circuit for the pair of shunt inductors.

Accordingly, turning to FIG. 3C, the magnetically-coupled filter 14 of FIG. 1 can include the equivalent circuit 84 in place of the pair of shunt inductors 56, 58 of FIG. 1. FIG. 3C depicts an exemplary schematic diagram of the magnetically-coupled filter 14 of FIG. 1, illustrating an equivalent circuit for the pair of shunt inductors 56, 58. In this manner, the performance of the magnetically-coupled filter 14 can be adjusted through changes in the characteristics of the components of the magnetically-coupled filter 14.

For example, the bandwidth of the second passband 72 can be adjusted through adjusting the k value (which affects the virtual inductance $L_b$ of the equivalent circuit of the magnetically-coupled filter 14). In addition, center frequency positions of the first notch (e.g., zero) 68 and the second notch 70 can be adjusted through changing capacitance values of the first series capacitor 60 and the second series capacitor 62 and/or the inductance values of the first shunt inductor 56 and the second shunt inductor 58. The frequency response 66 of the magnetically-coupled filter 14 can be further tuned through adjusting the capacitance of the bypass capacitor 64 (e.g., due to its resonance with the virtual inductance $L_b$ of the equivalent circuit shown in FIG. 3C, which may represent an induced inductance in the circuit shown in FIG. 1).

Figure 3D:
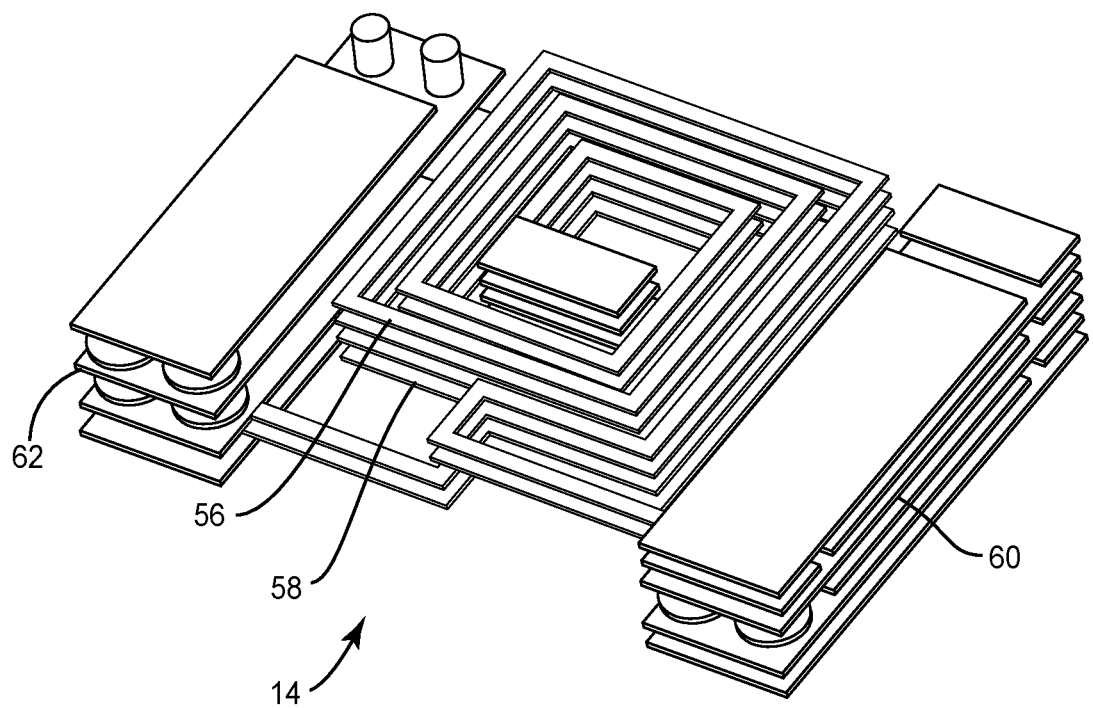
FIG. 3D depicts a schematic diagram of the magnetically-coupled filter of FIG. 1, illustrating an exemplary perspective view of the pair of shunt inductors.

As depicted in FIG. 3D, the first shunt inductor 56 and the second shunt inductor 58 of the magnetically-coupled filter 14 can be formed as a pair of vertically coupled inductors on adjacent metal layers separated by a low-loss dielectric. FIG. 3D depicts a schematic diagram of the magnetically-coupled filter 14 of FIG. 1, illustrating an exemplary perspective view of the pair of shunt inductors 56, 58. Each of the first shunt inductor 56 and the second shunt inductor 58 is formed from one or more conductive traces (including one or more metals such as copper, gold, silver, or tin, or non-metallic conductive materials) in a spiral, serpentine, or similar shape. The conductive traces of the pair of shunt inductors 56, 58 are separated by an appropriate low-loss dielectric (e.g., a dielectric with a substantially constant loss across RF frequencies—for example, 60 Hz to 10 GHz). Examples of low-loss dielectrics include fluoropolymers, Low Temperature Co-fired Ceramics (LTCC), and so on.

The coupling coefficient k is a function of the dielectric thickness and the degree of alignment between the conductive traces of the pair of shunt inductors 56, 58. As the dielectric thickness is reduced and/or the alignment of the conductive traces of the pair of shunt inductors 56, 58 is increased, the coupling coefficient k increases and insertion loss of the magnetically-coupled filter 14 improves. In an exemplary aspect, each of the conductive traces of the pair of shunt inductors 56, 58 have a vertical thickness of between 10 μm and 24 μm (e.g., 15-17 μm). The vertical thickness of the dielectric between each conductive trace is between 24 μm and 36 μm (e.g., 29-31 μm). As described above, the first shunt inductor 56 is coupled between a fixed voltage node (e.g., a circuit ground) and the first series capacitor 60 (which may be a parallel plate capacitor, as depicted), and the second shunt inductor 58 is similarly coupled between the fixed voltage node and the second series capacitor 62.

Figure 4:
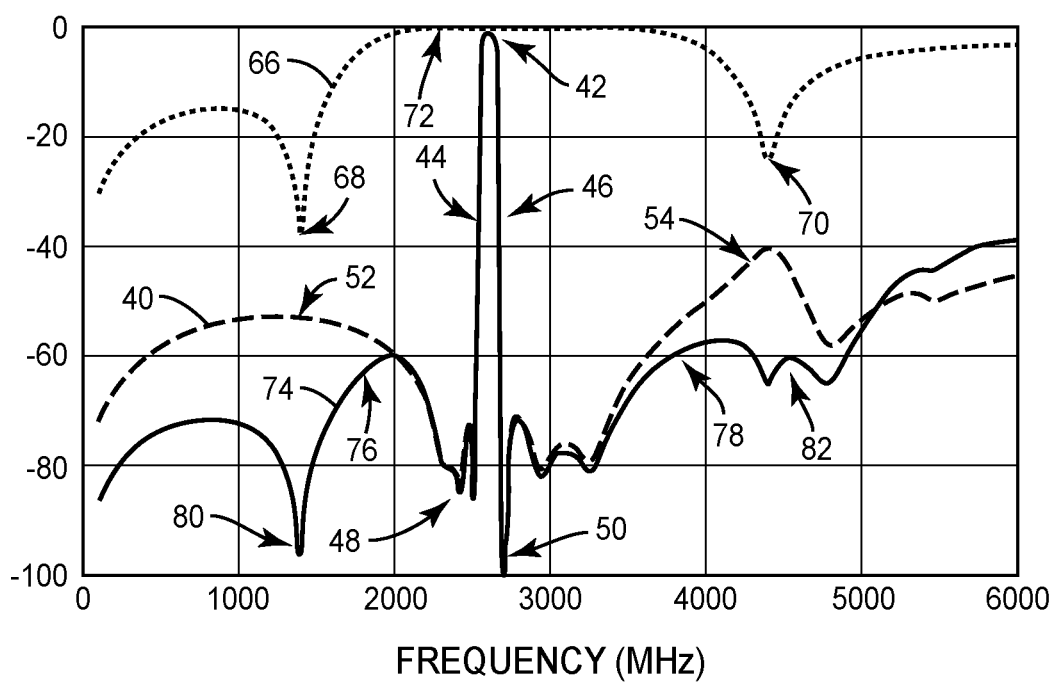
FIG. 4 depicts a graphical representation of another exemplary frequency response of the filter circuit of FIGS. 1-3C.

FIG. 4 depicts a graphical representation of another exemplary frequency response of the filter circuit 10 of FIGS. 1-3C. The graphical representation of FIG. 4 includes the frequency response 40 of the resonator-based filter 12, the frequency response 66 of the magnetically-coupled filter 14, and the frequency response 74 of the combined filter circuit 10 as depicted in FIG. 1 and deploying practical circuit components. In this regard, the graphical representation of FIG. 4 has features similar to the graphical representation of FIG. 2.

In this regard, the resonator-based filter 12 has the frequency response 40 as depicted in FIG. 4 which has a relatively low insertion loss at the passband 42 and high Q transition skirts 44, 46 leading to higher rejection regions 48, 50 above and below the passband 42. The frequency response 40 of the resonator-based filter 12 also has an out-of-band flyback 52, 54 near the passband 42. In order to reduce or mitigate the out-of-band flyback 52, 54 of the resonator-based filter 12, the filter circuit 10 incorporates the magnetically-coupled filter 14. The magnetically-coupled filter 14 has the frequency response 66 which contributes a low insertion loss within the first passband 42 (e.g., less than 2 dB insertion loss, which may further be less than 0.4 dB or between 0.30 and 0.40 dB insertion loss) and also contributes the first notch (e.g., zero) 68 and the second notch 70.

Accordingly, the frequency response 74 of the filter circuit 10 depicted in FIG. 4, combines the effects of the frequency response 40 of the resonator-based filter 12 and the frequency response 66 of the magnetically-coupled filter 14. The frequency response 74 of the filter circuit 10 has a low insertion loss within the first passband 42 (e.g., less than 4 dB insertion loss, which may be less than 2.8 dB or between 2.0 and 2.8 dB insertion loss). In an exemplary aspect, the first passband 42 can be a 60 MHz band (e.g., frequency range), or it may be a wider band (e.g., between 60 MHz and 200 MHz) or a narrower band (e.g., between 10 MHz and 60 MHz). In some examples, the first passband 42 can be centered within 10 MHz of 2600 MHz (e.g., the 2.6 GHz LTE and Wi-Fi band), while in other examples the first passband 42 can be centered at another frequency.

The frequency response 74 of the filter circuit 10 also has the high Q transition skirts 44, 46 leading to the higher rejection regions 48, 50 above and below the passband 42. The frequency response 74 of the filter circuit 10 has the out-of-band flyback 76, 78 near the passband 42, which is mitigated by the inclusion of the first notch 80 (e.g., due to the contribution of the first notch 68 of the magnetically-coupled filter 14) below the passband 42 and the second notch 82 (e.g., due to the contribution of the second notch 70 of the magnetically-coupled filter 14) above the passband 42. As a result, the frequency response 74 of the filter circuit 10 has high rejection within a frequency range below the passband 42 and within a frequency range above the passband 42.

In an exemplary aspect, the filter circuit 10 has greater than 50 dB of rejection in a frequency range from 100 MHz below the passband 42 to 2 GHz below the passband 42. The filter circuit 10 also has greater than 50 dB of rejection in a frequency range from 100 MHz above the passband 42 to 2 GHz above the passband 42. In another aspect, the same frequency ranges may have greater than 60 dB rejection. In another aspect, the filter circuit 10 has rejection greater than 60 dB within a 900 MHz band centered on the first notch 80 and greater than 50 dB rejection within a 400 MHz band centered on the second notch 82.

Those skilled in the art will recognize improvements and modifications to the preferred embodiments of the present disclosure. All such improvements and modifications are considered within the scope of the concepts disclosed herein and the claims that follow.

What is claimed is:

1. A filter circuit, comprising:
   a first circuit port;
   a second circuit port;

a first filter connected between the first circuit port and the second circuit port, comprising a plurality of acoustic wave resonators in a ladder configuration; and a second filter connected in series with the first filter between the first circuit port and the second circuit port, the second filter comprising:

a bypass capacitor connected between the first circuit port and the first filter;

a first shunt inductor magnetically coupled to a second shunt inductor, wherein the first shunt inductor is not electrically connected to the second shunt inductor; and a first series capacitor connected between the first shunt inductor and the first circuit port.

2. The filter circuit of claim 1, wherein the second filter further comprises a second series capacitor connected between the second shunt inductor and the first filter.

3. The filter circuit of claim 1, wherein the first filter comprises a series branch connected between the first circuit port and the second circuit port, the series branch comprising:

a first series resonator of the plurality of acoustic wave resonators connected between a first node and a second node in the series branch; and a second series resonator of the plurality of acoustic wave resonators connected between the second node and a third node in the series branch.

4. The filter circuit of claim 3, wherein the first filter further comprises a first shunt resonator of the plurality of acoustic wave resonators connected between the second node and a fixed voltage node.

5. The filter of circuit of claim 4, wherein the first filter further comprises a second shunt resonator of the plurality of acoustic wave resonators connected between the first node and the fixed voltage node.

6. The filter circuit of claim 1, wherein the plurality of acoustic wave resonators comprise at least one Bulk Acoustic Wave (BAW) resonator.

7. The filter circuit of claim 1, wherein the plurality of acoustic wave resonators comprise at least one Surface Acoustic Wave (SAW) resonator.

8. A filter circuit, comprising:

a resonator-based filter comprising a plurality of resonators and configured as a band pass filter for a first frequency range; and a magnetically-coupled filter comprising a pair of shunt inductors magnetically coupled together and configured to reduce a flyback response of the resonator-based filter in a second frequency range below the first frequency range and a third frequency range above the first frequency range.

9. The filter circuit of claim 8, wherein the magnetically-coupled filter contributes less than 2 dB of signal attenuation in the first frequency range.

10. The filter circuit of claim 8, wherein the filter circuit produces less than 4 dB insertion loss within the first frequency range and greater than 50 dB rejection within the second frequency range and the third frequency range.

11. The filter circuit of claim 8, wherein the plurality of resonators comprises at least one of a Bulk Acoustic Wave (BAW) resonator or a Surface Acoustic Wave (SAW) resonator.

12. The filter circuit of claim 8, wherein the plurality of resonators comprises at least one of a ceramic resonator or a Dielectric Resonator Oscillator (DRO).

13. The filter circuit of claim 8, wherein the pair of shunt inductors are electrically isolated from each other.

14. The filter circuit of claim 13, wherein the magnetically-coupled filter further comprises:

a first series capacitor connected between the pair of shunt inductors and a first circuit port; and a second series capacitor connected between the pair of shunt inductors and the resonator-based filter.

15. The filter circuit of claim 14, wherein the magnetically-coupled filter further comprises a bypass capacitor connected between the first circuit port and the resonator-based filter.

16. The filter circuit of claim 14, wherein the resonator-based filter comprises a series branch connected between the first circuit port and a second circuit port, the series branch comprising:

a first series resonator of the plurality of resonators connected between a first node and a second node in the series branch; and a second series resonator of the plurality of resonators connected between the second node and a third node in the series branch.

17. The filter circuit of claim 16, wherein the resonator-based filter further comprises:

a first shunt resonator of the plurality of resonators connected between the first node and a fixed voltage node; and a second shunt resonator of the plurality of resonators connected between the second node and the fixed voltage node.

18. A filter circuit, comprising:

a first circuit port;

a second circuit port;

a first filter connected between the first circuit port and the second circuit port, comprising a plurality of acoustic wave resonators in a ladder configuration; and a second filter connected in series with the first filter between the first circuit port and the second circuit port, the second filter comprising:

a first shunt inductor magnetically coupled to a second shunt inductor; and a bypass capacitor connected between the first circuit port and the first filter.

* * * * *